United States Patent [19]

Hebert et al.

[11] Patent Number: 5,439,833
[45] Date of Patent: Aug. 8, 1995

[54] METHOD OF MAKING TRULY COMPLEMENTARY AND SELF-ALIGNED BIPOLAR AND CMOS TRANSISTOR STRUCTURES WITH MINIMIZED BASE AND GATE RESISTANCES AND PARASITIC CAPACITANCE

[75] Inventors: Francois Hebert, Sunnyvale; Datong Chen, Fremont; Rashid Bashir, Santa Clara, all of Calif.

[73] Assignee: National Semiconductor Corp., Santa Clara, Calif.

[21] Appl. No.: 213,630

[22] Filed: Mar. 15, 1994

[51] Int. Cl.[6] .......................................... H01L 21/265
[52] U.S. Cl. ........................ 437/31; 148/DIG. 9; 257/370; 257/371; 257/378; 437/27; 437/44; 437/59; 437/200
[58] Field of Search ................ 437/59, 44, 31, 27, 437/200; 148/DIG. 9; 257/370, 371, 378

[56] References Cited

U.S. PATENT DOCUMENTS

| | | | |
|---|---|---|---|
| 4,694,562 | 9/1987 | Iwasaki et al. | 257/370 |
| 4,735,911 | 4/1988 | Schaber | 437/33 |
| 4,737,472 | 4/1988 | Schaber et al. | 437/59 |
| 4,755,476 | 7/1988 | Bohm et al. | 437/31 |
| 5,026,654 | 6/1991 | Tanba et al. | 257/370 |
| 5,091,322 | 2/1992 | Maeda et al. | 437/31 |
| 5,100,811 | 3/1992 | Winnerl et al. | 437/31 |
| 5,132,234 | 7/1992 | Kim et al. | 437/59 |
| 5,196,356 | 3/1993 | Won et al. | 437/59 |
| 5,278,084 | 1/1994 | Lee et al. | 437/59 |

OTHER PUBLICATIONS

D. J. Roulston, Bipolar Semiconductor Devices, Chapter 14, pp. 340–367, published by McGraw-Hill, Inc. (1990).

Schaber et al., "Process and Device Related Scaling Considerations for Polysilicon Emitter Bipolar Transistors", IEDM Technical Digest pp. 170–172 (1987).

Primary Examiner—Olik Chaudhuri
Assistant Examiner—Long Pham
Attorney, Agent, or Firm—Limbach & Limbach; H. Donald Nelson

[57] ABSTRACT

A truly complementary bipolar transistor structure and a combined bipolar and CMOS transistor structure are disclosed, each including a silicide layer formed upon a substrate that acts as an extrinsic base and gate. Optionally, a layer of polysilicon can be formed between the silicide layer and the substrate. An oxide layer (LTO) is formed or deposited over the silicide layer by chemical vapor deposition (CVD). Selected regions are defined and etched using a photoresist layer. Subsequent steps of implanting, etching and metalization are performed to produce transistors with reduced gate and extrinsic base resistances. Polysilicon may be used, instead of metal, as a contact in one embodiment of the invention.

16 Claims, 11 Drawing Sheets

METHOD OF MAKING TRULY COMPLEMENTARY AND SELF-ALIGNED BIPOLAR AND CMOS TRANSISTOR STRUCTURES WITH MINIMIZED BASE AND GATE RESISTANCES AND PARASITIC CAPACITANCE

FIELD OF THE INVENTION

The present invention relates to bipolar and CMOS transistor structures and to a method of making these structures for use in high-frequency analog circuits, such as amplifiers, comparators and sample and hold circuits. The present invention also has applicability in high frequency communication circuits, including wireless and fiber optic applications.

BACKGROUND OF THE INVENTION

Self-aligned bipolar transistor structures are known in the prior art. The two basic types of self aligned bipolar transistor structures commonly used in the industry are those with spacers outside the emitter and those with spacers inside the emitter. The structures with spacers outside the emitter generally use one polysilicon layer for the emitter formation and are known as single-poly self-aligned transistors, which resemble self-aligned poly-gate MOS devices. These structures are not very pertinent to the present invention and therefore are not discussed in detail.

On the other hand, the structures with spacers inside the emitter are related to the present invention and will be discussed in more detail. These structures generally use two polysilicon layers and are known as double-poly self-aligned transistors. A general discussion of these transistors is provided by David J. Roulston, BIPOLAR SEMICONDUCTOR DEVICES, Chapter 14, pp. 340-367, published by McGraw-Hill, Inc., (1990).

Generally, double-poly self-aligned transistors use spacers not only to separate the emitter from the base electrode but also to reduce the effective emitter width to a dimension smaller than minimum critical dimensions (CDs) allowed by lithographic constraints.

Figure 1:
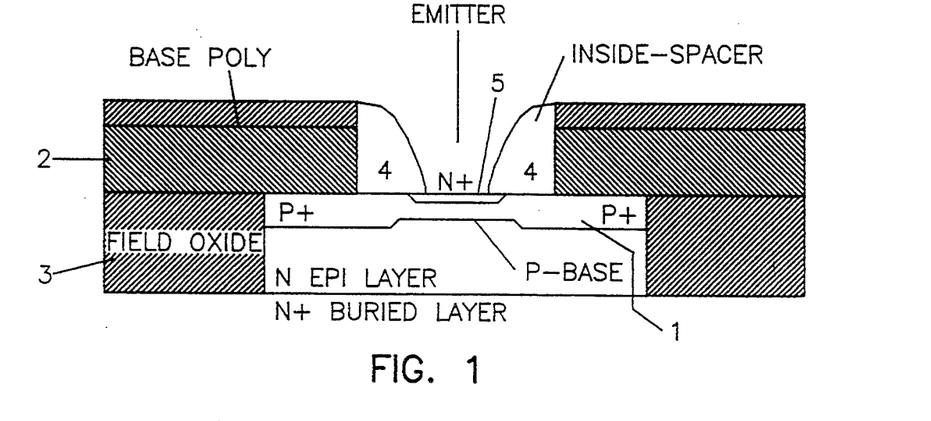
FIG. 1 is an illustration of a conventional self-aligned bipolar transistor structure (an NPN transistor structure is shown).

An example of the prior art structure is shown in FIG. 1. The main feature of this structure is that the base 1 of the transistor is placed in contact with a polysilicon electrode 2 which overlaps the field oxide layer 3. Also, the perimeter of emitter 5 is defined by spacers 4 formed along the inside edges of the polysilicon electrode 2.

The emitter 5 may be placed directly in contact with the metal (resulting in the lowest emitter resistance) or by a second poly layer (not shown). This second poly layer is what gives this structure the name double-poly transistor. Also, the base 1 is in contact with the polysilicon electrode 2 overlying the field oxide layer, which reduces the collector-base capacitance and minimizes the silicon base-collector junction area.

Finally, the use of inside spacers 4 results in a smaller emitter than defined by lithographic pattern size.

One problem with prior art structures, such as the one shown in FIG. 1, is that the standard double-poly transistor has a base resistance component which comes from the base polysilicon electrode. This resistance is generally in the range of 50 to 100 ohms/square. This is due to the resistivity of the polysilicon as determined by mobility of carriers present therein and the amount of doping.

SUMMARY OF THE INVENTION

The present invention provides a method and structure resulting from practicing the method that overcome the problems associated with the prior art by using a simplified process for reducing base and gate resistances in a truly complementary BiCMOS processby using a single metal silicide layer as the base and gate electrodes. The metal silicide is formed or deposited in such a manner that it reaches all the way to the emitter edges as the base electrode. By using a metal silicide, the extrinsic base resistance can be easily reduced to less than 5 ohms per square, depending upon the resistivity and thickness of the silicide used. As a result, the extrinsic base resistance can be reduced more than ten-fold. The extrinsic base can serve as a single base contact thereby reducing net device size.

Additionally, the lowered resistance does not come at the cost of losing other advantages of the inside emitter configuration. For example, the collector-base capacitance is minimized by overlapping the extrinsic base over the field oxide regions. The base contact locations are not critical because the entire extrinsic base is a low resistance silicide. Emitter resistance is low because there is no need to use polysilicon as a contact as would be needed with outside spacers.

In addition to minimizing extrinsic base resistance, the intrinsic base resistance is reduced by achieving emitter dimensions smaller than those achievable through masking techniques.

Also, the method followed according to the present invention is compatible with standard manufacturing techniques and equipment and can be easily implemented.

The base electrode may also be used as an interconnect. For example, current mirrors could have all of the bases of their transistors tied by using the new polycide or silicide base rather than the metal. The advantage of doing this is that by using the free layer of interconnect, device to device spacing is minimized.

Finally, compatible high-Q (high-quality) capacitors can be realized using the base electrode, the oxide and first metal layer and the process can simultaneously produce npn, and pnp transistors as well as CMOS devices. Unlike prior art approaches, the silicide is deposited over the entire substrate and is selectively doped for its various uses.

BRIEF DESCRIPTION OF THE DRAWINGS

FIGS. 2-10 illustrate a self-aligned bipolar transistor structure according to a preferred embodiment of the present invention. Each Figure specifically shows the following:

FIGS. 11–21 illustrate a bipolar and CMOS transistor structure according to another embodiment of the present invention. Each Figure particularly shows the following:

DETAILED DESCRIPTION OF THE PREFERRED EMBODIMENTS

FIGS. 2–10 detail the fabrication steps and the structures resulting according to a preferred embodiment of the present invention. Before going through the step by step process, it is important to consider the key requirements that must be satisfied to produce a suitable structure.

First, the silicide that is chosen must be able to withstand high temperatures because it is deposited prior to the formation of the inside-spacer and emitter. Second, the silicide must be a good diffusion source because the extrinsic base (ie. the contact to silicon adjacent to emitter) will be formed in a self-aligned fashion by out diffusion of dopants from the silicide or polycide (silicide plus polysilicon) into the mono-silicon. Therefore, it is desirable to have a high doping concentration at the interface. Third, the film that is used must be patternable or, in the alternative, a salicide process using the selected metal must be feasible. Finally, the film's roughness must be minimized to obtain controlled capacitance when a conductor and insulator sandwich is deposited on top. Another advantage of having a film with a smooth surface is that when the film is etched, the post-etch surface will also be smooth. Otherwise, the roughness of the surface may passed on to the post etch surface.

The most popular silicide films are titanium (Ti), cobalt (Co) and tungsten (W) compounds. $TiSi_x$ has problems forming good low-resistance contacts to boron doped junctions (this is due in part to the fact that Ti and B combine in a manner that inhibits the diffusion of boron through the film). $CoSi_x$ has a limited total thermal exposure capability that has been shown to be less 1000 degrees Celsius for short periods of time. Also, $CoSi_x$ cannot be selectively dry etched.

$WSi_x$ is considered to be the best candidate for the film because it is stable at very high temperatures, is a good diffusion source, has low-contact resistance and can be etched with fluorine. Also, the subscript "x", in $WSi_x$, should be preferably be chosen within the range of 1.8 to 2.5. The best method for forming this film is believed to be by sputtering from a compound target. It should be noted that to achieve a value of "x", the compound target should have an "x" value between 2 and 3 to achieve a deposited "x" value of 1.8 to 2.5 due to the characteristics of sputtering silicon. This method results in a smoother film with a controlled composition. Also, in-situ native oxide removal is made possible by argon (Ar) sputtering.

Other high temperature materials such as molybdenum, chromium and tantalum (Ta) may be used instead of Tungsten, but their particular behavior in environments such as that discussed above have not been studied in detail.

The fabrication steps involved in forming the self-aligned transistor according to a preferred embodiment of the present invention will now be discussed in connection with FIGS. 2–10.

Figure 2:
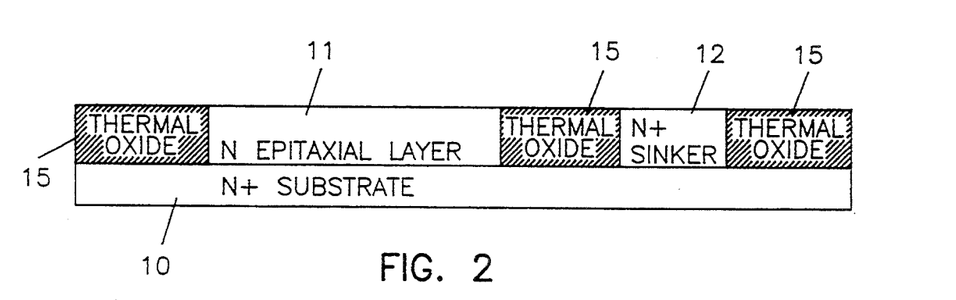
FIG. 2 is an illustration of a substrate with an oxide layer according to a preferred embodiment of the present invention.

As shown in FIG. 2, exposed silicon areas (such as the n-type epitaxial layer 11, which represents the active base, and N+ sinker 12) are defined using nitride and field oxide areas 15 are formed on a silicon wafer or substrate 10. Local oxidation of silicon (LOCOS) or recessed LOCOS may be used to define such areas. A discrete npn version with bottom side and top side collector contacts is shown for simplicity (N+ substrate and N+ sinker).

Figure 3:
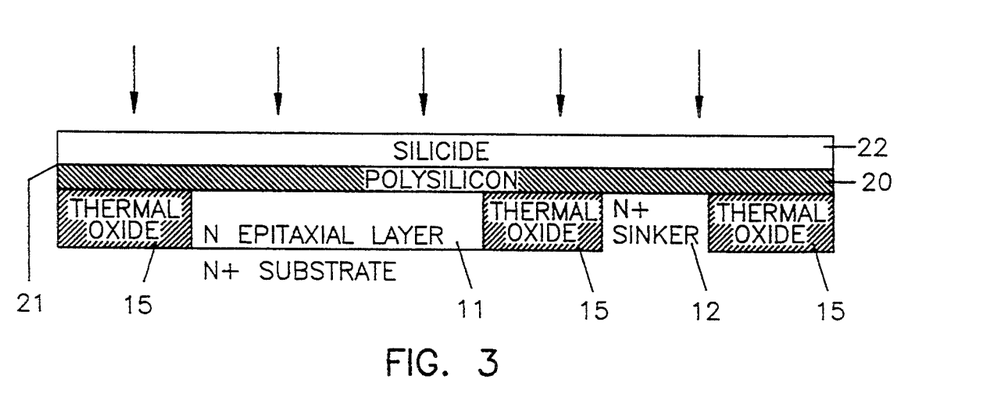
FIG. 3 is an illustration of the structure of FIG. 2 with polysilicon and silicide layers deposited thereon.

FIG. 3 shows a critical step of the present invention which involves depositing or forming a layer of silicide 22. Optionally, a layer of polysilicon 20 may also be deposited before adding the silicide. Although the Figures show the polysilicon layer 20 present, it is to be understood that polysilicon layer 20 may be removed from these Figures, resulting in the silicide being deposited or formed directly upon areas 11 and 12 and the oxide layer 15. In instances where polysilicon layer 20 is used, this layer is undoped and has a thickness in the range of approximately 500 to 3000 Angstroms, with 1500 Angstroms being the preferable thickness.

The silicide layer 22 may be formed in several ways. One way is by sputtering a metal (such as Ti, Co, or W, as discussed above) on the wafer. If a layer of polysilicon 20 has already been deposited, then the sputtered metal is caused to thermally react with the polysilicon layer 20, in a process known as silicidation. Alternatively, a co-sputtering process can be utilized in which the silicide and the polysilicon are simultaneously sputtered from separate targets upon the substrate. Finally, sputtering can be accomplished from a compound target, the compound being the combination of the metal and the silicon.

If the silicide layer 22 is to be deposited instead of being formed by sputtering, then a sputtered film from a composite target is preferably used to achieve a smooth film. As discussed above, $WSi_x$ is used because of its performance under exposure to high temperatures and its behavior as a good diffusion source for dopants.

The thickness of the silicide layer 22, whether formed or deposited, depends upon the amount of resistance desired. According to the preferred embodiment described in FIGS. 2-10, it has a thickness in the range of 2000 to 3500 Angstroms.

The silicide layer may be annealed at this time to reduce resistance without having the sputtered metal diffuse, because $WSi_2$ is a stable compound and no dopant is in the film at that time. Therefore, the annealing can be independently performed. Otherwise, if dopants had already existed in the silicide layer, annealing could not be performed in this manner.

Next, the extrinsic base is ion implanted using high dose shallow implants. For a pnp transistor structure, arsenic (As) or phosphorous (P) at 30-80 keV, with a dose of $3 \times 10^{15}$ to $8 \times 10^{15}$ atoms/cm3, is suitable. For an npn transistor structure, boron-difluoride ($BF_2$) at 30-100 keV or boron (B) at 10-70 keV, each with a dose of $3 \times 10^{15}$ atoms/cm3 to $8 \times 10^{15}$ atoms/cm3 is suitable. For best results, the implant peak should be near the silicide/polysilicon interface 21 when polysilicon is used (slightly above the interface in this embodiment) or slightly above the silicide to silicon interface when no polysilicon is used. Significantly, no masks are needed if only npn transistors or pnp transistors are made on the same wafer because the bulk of the dopant is within the silicide or polycide.

Figure 4:
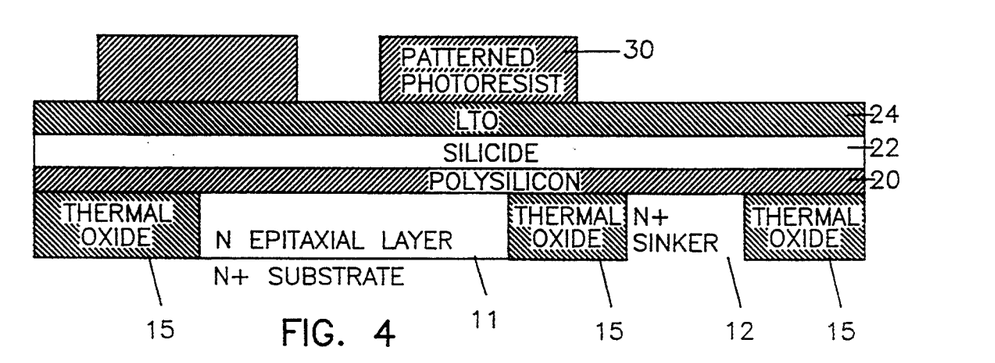
FIG. 4 is an illustration of the structure of FIG. 3 with an oxide layer and a patterned photoresist.
Figure 5:
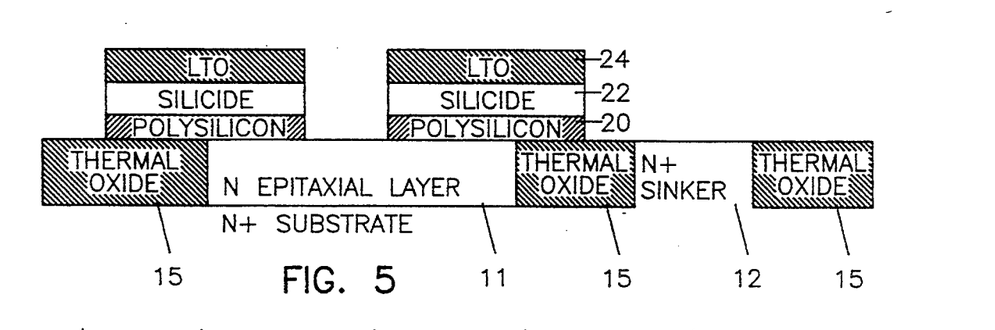
FIG. 5 is an illustration of the structure of FIG. 4 after an etching process is performed.

As shown in FIG. 4, a low temperature deposited oxide layer (LTO) 24, preferably 0.1 to 0.3 μm thick, is deposited and a photoresist layer 30 is deposited over the LTO and patterned so that the extrinsic base may be formed. The LTO serves as an insulator. Other insulators may be used such as oxynitride, silicon nitride, nitride and oxide, but LTO is preferred. The exposed LTO 24, silicide 22 and polysilicon 20 (if used) layers are then etched away from the exposed areas, as shown in FIG. 5. The etching process is stopped at the top surface of oxide layer 15 and epitaxial layer 11.

Specifically, the LTO is dry etched using gas chemistries which are selected depending upon the underlying film. Suitable chemistries include: $CF_4+H_2$, $CHF_3+O_2$, $CHF_3+C_2F_6$, or $CHF_3+CF_4$ in a reactive ion etching system (RIE). The silicide and polysilicon (if used) are etched using $CH_4+Cl_2$, $CF_4+Cl_2+O_2$, $Cl_2$, $SF_6+Cl_{2S}$, and the like, gas chemistries in an RIE system in which the etching is stopped on the surface of oxide layer 15 using visual and or optical emission endpoint methods. This may be accomplished using a spectrophotometer such as one used on the LAM Rainbow, Drytek or Applied Materials etchers. The photoresist layer 30 is then stripped away.

Figure 6:
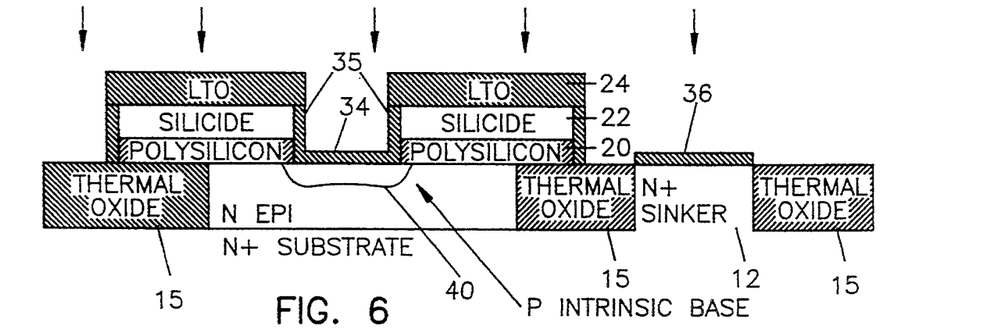
FIG. 6 is an illustration of the structure of FIG. 5 after a step of oxidation and ion implantation of the intrinsic base.

Next, the wafers are cleaned and, as shown in FIG. 6, a step of thermal oxidation is performed to cover up any areas that are not covered by an oxide layer such as areas 34 and 36 sidewalls such as 35. This oxidation step is preferably performed at 800-1000 degrees Celsius, preferably 900 degrees Celsius. The LTO 24 is also densified during this step. The oxide grown in this step can be in the range of 200 to 1000 Angstroms, with 300 Angstroms being the preferable amount.

The intrinsic base 40 is formed by ion implantation, without a mask, resulting in the structure shown in FIG. 6. Specifically, for npn bases the implantation is performed at 10-60 keV at $1 \times 10^{13}$ to $9 \times 10^{13}$ atoms/cm3. Preferably, boron (B) at 30 keV and at $2 \times 10^{13}$ atoms/cm3 is used. For pnp bases the implantation is performed at 80-160 keV at $1 \times 10^{13}$ to $9 \times 10^{13}$ atoms/cm3. Preferably, for pnp bases, phosphorous at 130 keV and at $3 \times 10^{13}$ atoms/cm3 is used. The energy level is selected to optimize transistor profile.

By using this method, any base implant in the collector region will be counter doped by the highly-doped collector N+ sinker 12, which was formed earlier. This method is particularly advantageous because the base implant is performed after the stack etch (See FIG. 4) and, therefore, the step of base doping is not sensitive to any over-etching of the exposed mono-silicon during that step.

Figure 7:
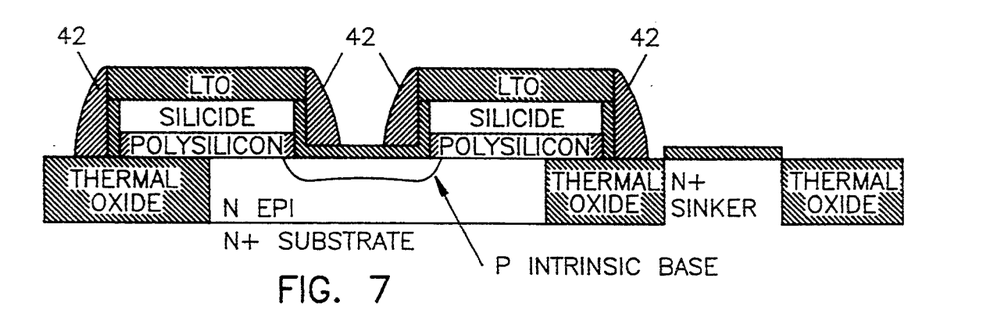
FIG. 7 is an illustration of the structure of FIG. 6 after nitride has been deposited by LPCVD and additional etching has been completed.

In order to form the inside spacers 42, a nitride layer is deposited using low pressure chemical vapor deposition (LPCVD), which is then etched back. The width of spacers 42 is preferably in the range of 0.2 to 0.35 μm and is dependant upon the final emitter lateral diffusion and the final extrinsic base lateral diffusion. The etching is controlled and stopped before it extends into oxide layer 15. The result is shown in FIG. 7. Thus, etching of the active emitter area does not become an issue.

Deposited oxide (LTO), by LPCVD or plasma-enhanced CVD, can also be used to form the spacers, but nitride is preferred because of the etch stop being at the surface of the oxide instead of the silicon. Therefore, the active areas are not exposed to etchant.

Figure 8:
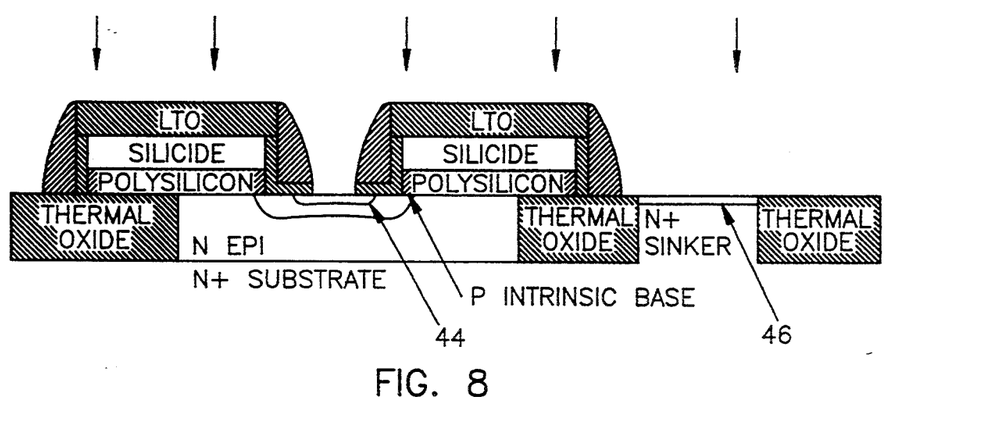
FIG. 8 is an illustration of the structure of FIG. 7 after the emitter has been implanted.

Next, the layer of thin oxide (34, 36) is etched selectively using a chemical such as HF acid and the emitter 44 is implanted as shown in FIG. 8. For npn transistors, shallow As at a dose of $5 \times 10^{15}$ to $1 \times 10^{16}$ atoms/cm$^3$ at 30 keV to 90 keV is suitable. Preferably, a dose of $6 \times 10^{15}$ at 50 keV is used. For pnp transistors, shallow $BF_2$ at a dose of $3 \times 10^{15}$ to $9 \times 10^{15}$ atoms/cm$^3$ at 20 keV to 60 keV or boron in the 5-15 KeV range, is suitable. Preferably, a dose of $6 \times 10^{15}$ atoms/cm$^3$ at 20 keV is used. No mask is needed because the extrinsic base is covered by the densified LTO 24. If desired, a second polysilicon film (not shown) may be deposited and patterned just before emitter implantation to form a poly-emitter (and collector contact). The advantage of using a poly-emitter is that the current gain of the transistor can be improved through an increase in the emitter efficiency. Disadvantages include high emitter resistance, reduced transconductance and increased noise.

Collector 46 is also implanted to reduce contact resistance because the collector is in the exposed silicon area.

Figure 9:
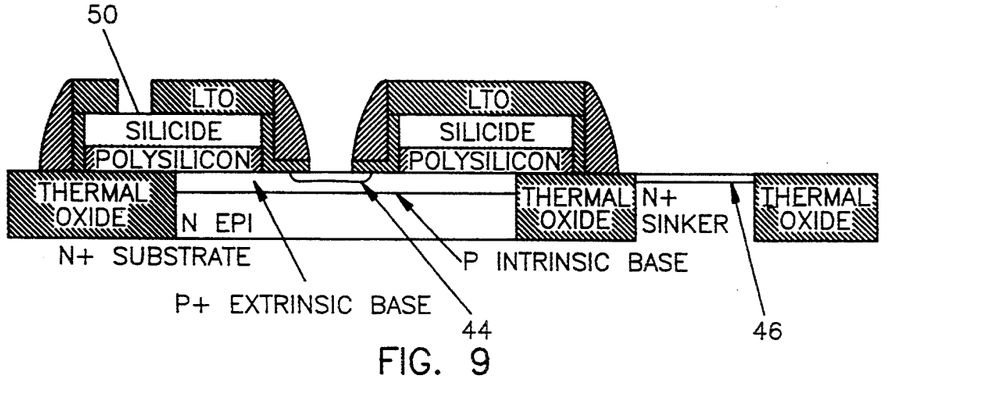
FIG. 9 is an illustration of the structure of FIG. 8 after a final drive in step has been performed and the base contacts have been defined and etched.

As shown in FIG. 9, the base contact 50 is defined and etched after a final drive-in step. The highly doped extrinsic base acts like a self-aligned diffusion source. The thermal budget is adjusted to minimize the base-collector junction depth. Rapid thermal anneal (RTA) at 1000 to 1100 degrees Celsius for 20 to 60 seconds may be used (preferably 1100 degrees Celsius for 40 seconds for npn and 1050 degrees Celsius for 60 seconds for pnp). Thermal budget is determined according to the total amount of exposure, time and temperature. One goal is to maximize temperature to minimize silicide resistance.

A photoresist layer is used to pattern the base contacts in the extrinsic base regions overlying the field oxide regions. This step is non-critical given the characteristics of the extrinsic base. Etching of the oxide may be accomplished using conventional etching processes such as with $CF_4+H_2$, $CHF_3+O_2$, $CHF_3+C_2F_6$, or $CHF_3+CF_4$, etc., in an RIE system.

Figure 10:
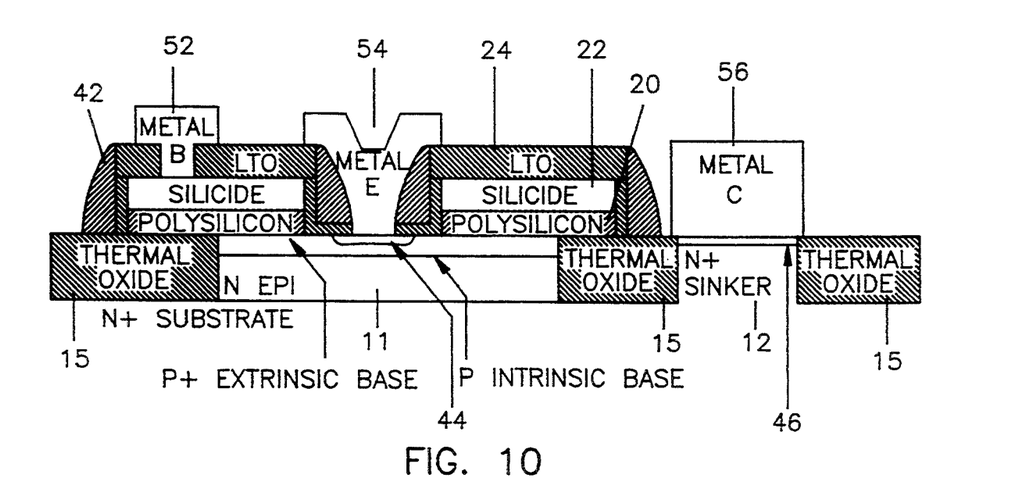
FIG. 10 is an illustration of the structure of FIG. 9 after a step of metalization.

Then metalization is performed to form contacts 52, 54 and 56 for the base, emitter and collector, respectively, as shown in FIG. 10. Standard metalization processes may be used in this step.

With the configuration described above in connection with FIGS. 2–10, high-Q capacitors can be generated by using metal formed during the metalization step as the top electrode, the densified LTO as the dielectric, and the low resistance silicide or polycide extrinsic base as the bottom electrode.

Also, if desired, the silicide may be caused to come into contact with the collectors, provided that the correct dopant is used. For example, in an npn transistor, boron is used as the dopant in the extrinsic base. The collector is doped with phosphorous or arsenic. This collector can be contacted with the extrinsic base (silicide or polycide layer) of a nearby pnp transistor. The reverse is true where a pnp transistor doped with phosphorous or arsenic in the extrinsic base is considered. In that case, the collector would be doped with boron. The extrinsic base (silicide or polycide layer) of a nearby npn transistor could then be placed in contact with this boron doped collector.

The advantages of having the silicide or polycide layer of one transistor in contact with a similarly doped collector region of a nearby transistor is that this way an extra connection level is provided to the collector. Also, base metal can lie over collector contact without any electrical shorts.

Base resistance reduction is important because for transistors used in analog and RF applications, it is critical to minimize noise and maximize bandwidth. The noise can be attributed in large part to two sources. One source is "shot noise" which is caused by the base and collector currents. The other source is thermal noise which is caused by resistances such as base resistance and emitter resistance. Therefore, minimizing resistance will reduce the thermal noise.

Simply stated, transistor bandwidth is determined by the transition frequency and all of the RC delays within (intrinsic) and directly connected to (extrinsic) the transistor. The most accurate and useful figure of merit for a bipolar device used in high-frequency and low-noise type applications, is called the maximum frequency of oscillation ($f_{max}$). The maximum frequency of oscillation, $f_{max}$, is defined according to equation (1).

$$f_{max}=sqrt[f_t/(8\ Pi\times R_{bb}\times C_{jc})], \quad (1)$$

where $R_{bb}$ is the base resistance; $f_t$ is the transition frequency; and $C_{jc}$ is the collector-base junction capacitance. The transition frequency of any transistor is equal to the time required for carriers to cross the transistor. For example, in npn transistors, transition frequency is determined by the time it takes for electrons to cross from the emitter to the collector. Thus the transition frequency takes into account carrier delays and internal charging times.

Thus, according to the present invention, fmax is maximized because the Rbb is reduced by using a low resistance metal and Cjc is reduced by contacting the base from the top, while at the same time, ft is unaffected. In other words, the numerator of equation (1) remains unchanged, while the denominator is decreased.

A second embodiment of the present invention is depicted in FIGS. 11–21. This embodiment enjoys many of the same benefits and advantages of the present invention as discussed with respect to the embodiment depicted in FIGS. 2–10. According to this embodiment, both bipolar (npn and pnp) and CMOS devices are formed with minimized gate and extrinsic base resistances. The fabrication steps will now be discussed in more detail. Many of the steps are similar to steps discussed with respect to the first embodiment. Accordingly, it is to be understood that much of the discussion above has equal applicability to the embodiment disclosed below, even where some of that discussion is not explicitly repeated. In particular, the ion implanting and etching steps are performed similarly to corresponding steps in the first embodiment.

Figure 11:
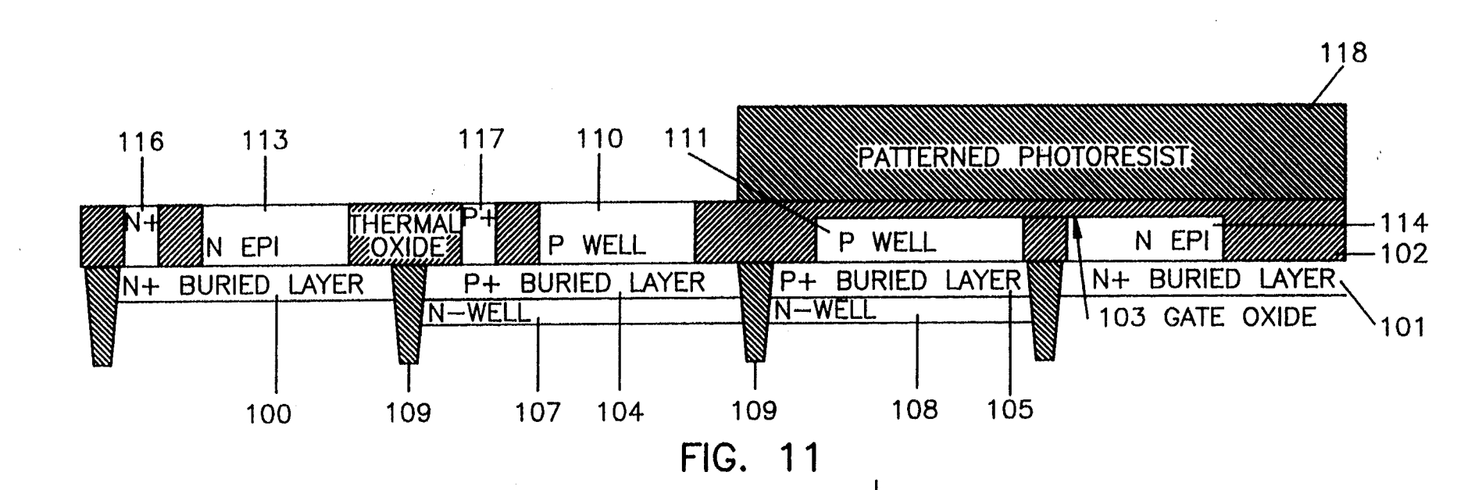
FIG. 11 is an illustration of the structure of the second embodiment of the present invention in which active areas are defined, field oxide has been formed and oxide has been etched from the bipolar areas using a photoresist.

As shown in FIG. 11, the exposed areas are defined and the field oxide 102 is formed. The exposed areas include base areas 110, 113, npn collector region 116, pnp collector region 117, NMOS active region 111, PMOS active region 114. The N+ buried layers 100 and 101 and P+ buried layers 104 and 105 are defined using known techniques, as are N-wells 107 and 108. Additionally, isolation trenches (or oxides) 109 are used to separate transistors in the substrate. After growth of the gate oxide 103, the threshold implants are carried out. A patterned photoresist 118 is used to etch away the gate oxide from the bipolar transistor areas.

Figure 12:
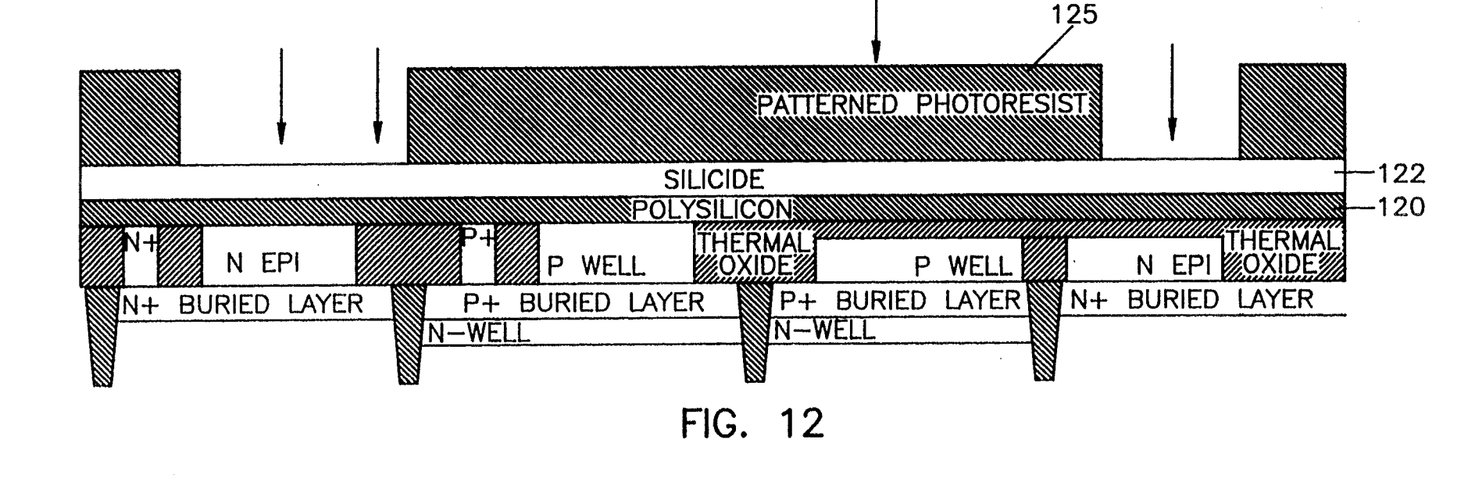
FIG. 12 is an illustration of the structure of FIG. 11 with the polysilicon and silicide layer formed and with photoresist layer for defining the extrinsic base and gate.

A layer of polysilicon 120 is deposited on top of the oxide and a layer of silicide 122 is either deposited or formed on top of the polysilicon layer 120, as shown in FIG. 12. The polysilicon layer 120 is optional in this embodiment just as in the first embodiment relating to FIGS. 2–10. The extrinsic base and gate are implanted together using a photoresist mask 125.

Figure 13:
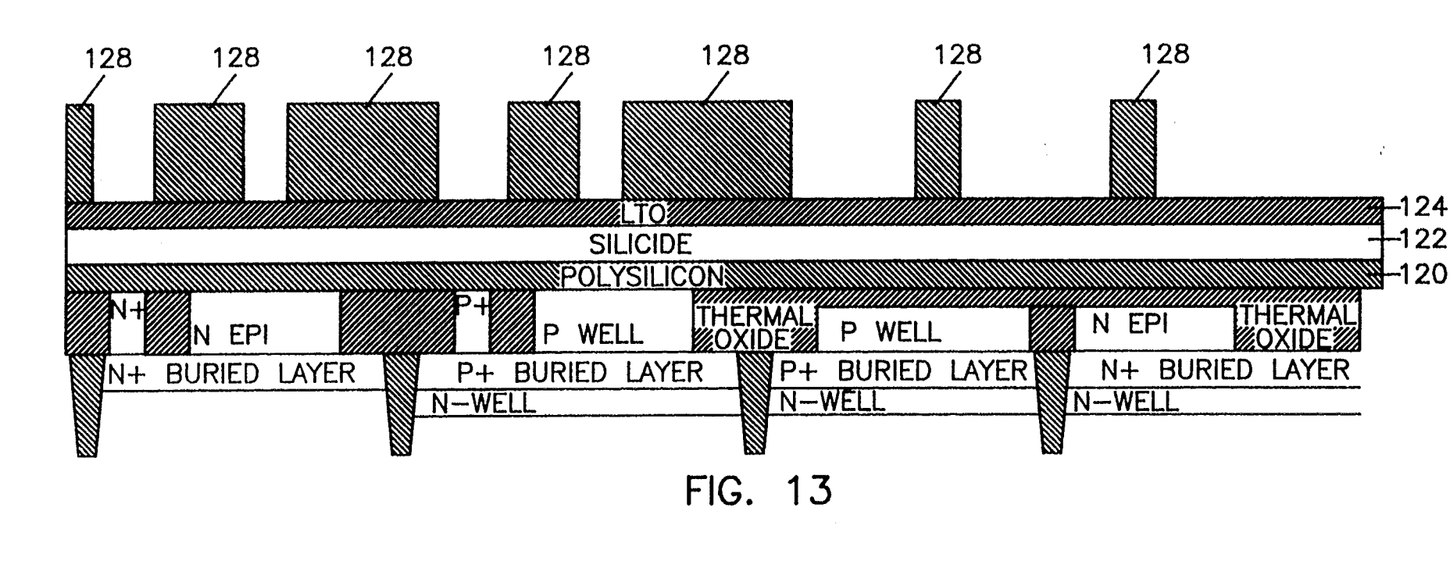
FIG. 13 is an illustration of the structure of FIG. 12 after a layer of oxide (LTO) has been formed and showing a resist layer for patterning the extrinsic base.
Figure 14:
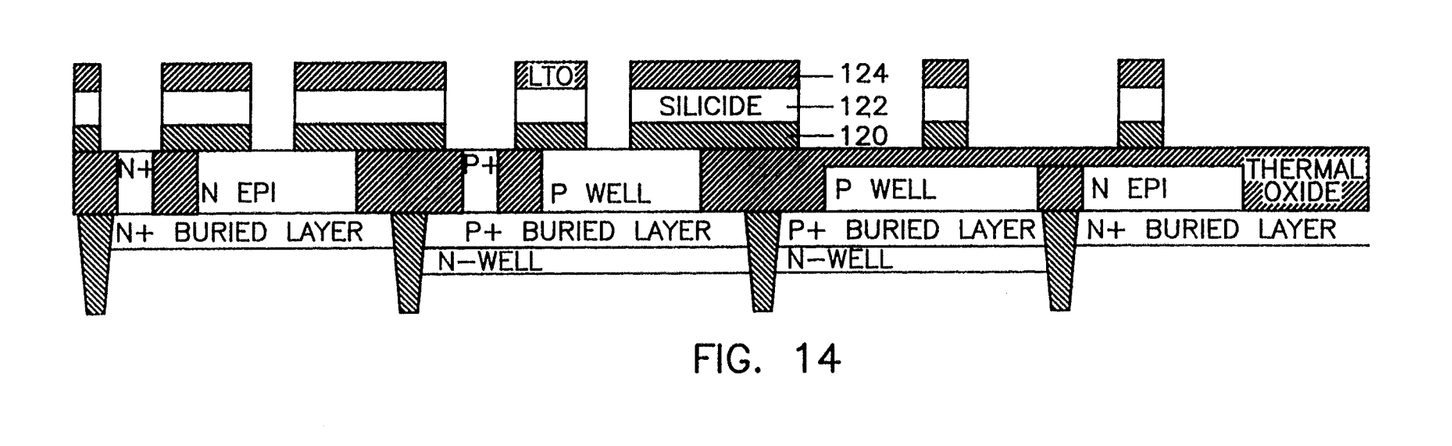
FIG. 14 is an illustration of the structure of FIG. 13 after a step of etching and after the resist has been stripped.

An oxide (LTO) layer 124 is deposited as shown in FIG. 13, on top of the silicide layer 122. The fabrication of npn and pnp transistors on the same structure optimizes gate doping of the PMOS and NMOS devices. For example, the pnp extrinsic base doping can be performed simultaneously with NMOS gate doping. The extrinsic base is patterned using a photoresist 128. LTO 124, silicide 122 and polysilicon 120 are etched (as discussed earlier with respect to the previous embodiment) and the photoresist 128 is stripped away resulting in the structure of FIG. 14.

Figure 15:
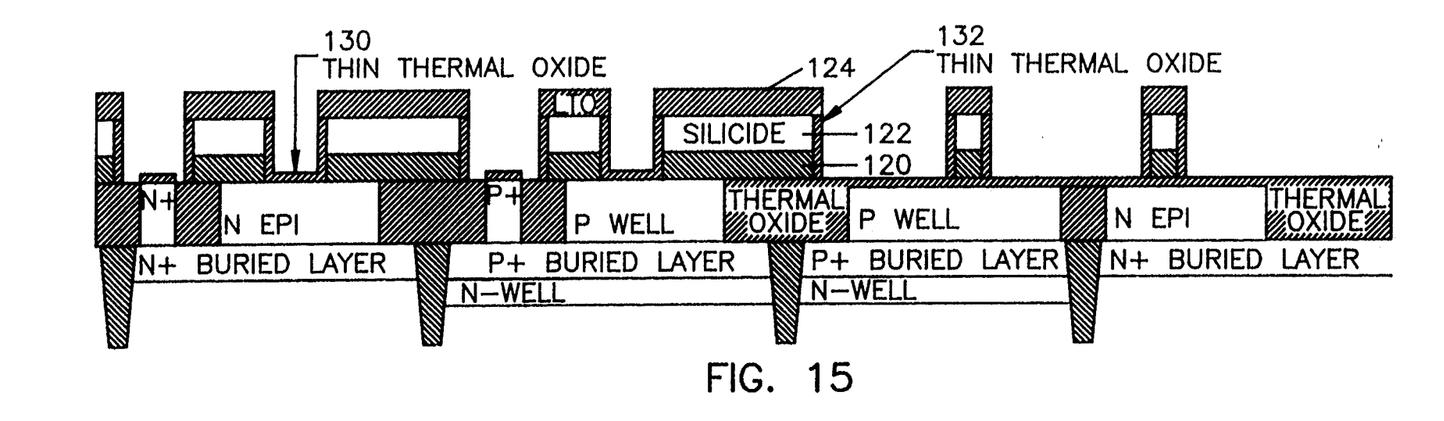
FIG. 15 is an illustration of the structure of FIG. 14 after a step of oxidation of the exposed areas.

Next, the silicon wafer is oxidized, producing some sections of thin oxide, such as 130 and 132, as shown in FIG. 15. Also, the LTO 124 is densified during this oxidation step. Once again, the temperature at which oxidation is performed should be in the range of 800–1000 degrees Celsius, with 900 degrees Celsius being the preferable temperature.

Figure 16:
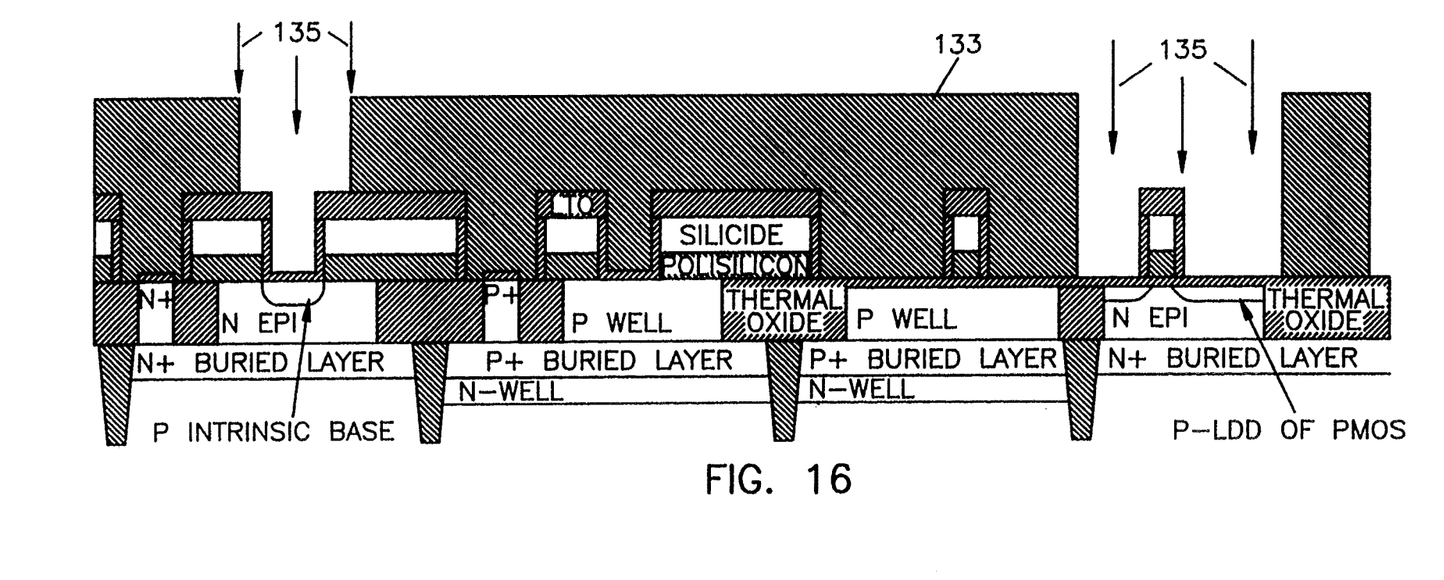
FIG. 16 is an illustration of the structure of FIG. 15 showing the use of another resist to pattern the npn bases and the PMOS source/drain areas.

In FIG. 16, another photoresist 133 is used to pattern the npn bases as well as the PMOS source/drain areas. Boron is implanted during this step, as shown by arrows 135. The photoresist 133 is stripped away and the steps are repeated for the pnp bases and the NMOS source/drain areas. Instead of boron, arsenic or phosphorous is implanted. The photoresist is once again stripped. These implants form the low doped drain (LDD) of the CMOS devices.

Figure 17:
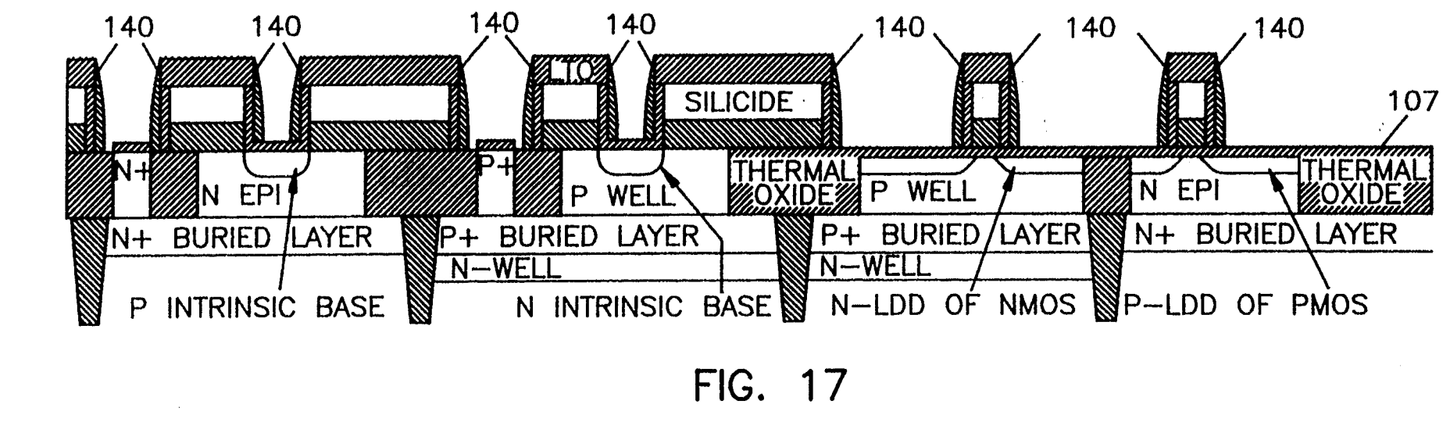
FIG. 17 is an illustration of the structure of FIG. 16 after nitride has been deposited by LPCVD and etched back to form self-aligned spacers.

Nitride is deposited and etched back, anisotropically (vertically), to form the self-aligned spacers 140 as shown in FIG. 17. The etching is halted before extending into the layer of field oxide 102. The deposition of the nitride is preferably accomplished via LPCVD, but plasma enhanced CVD may be used although the resulting film conformality may not be as great.

Figure 18:
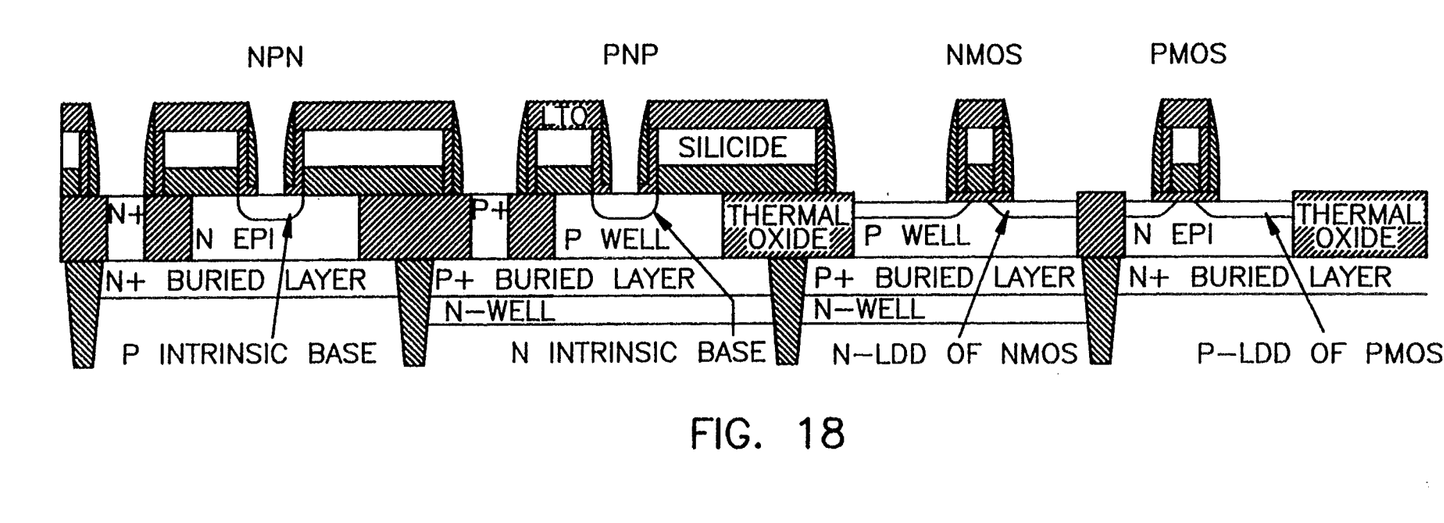
FIG. 18 is an illustration of the structure of FIG. 17 after the thin oxide has been etched.
Figure 19:
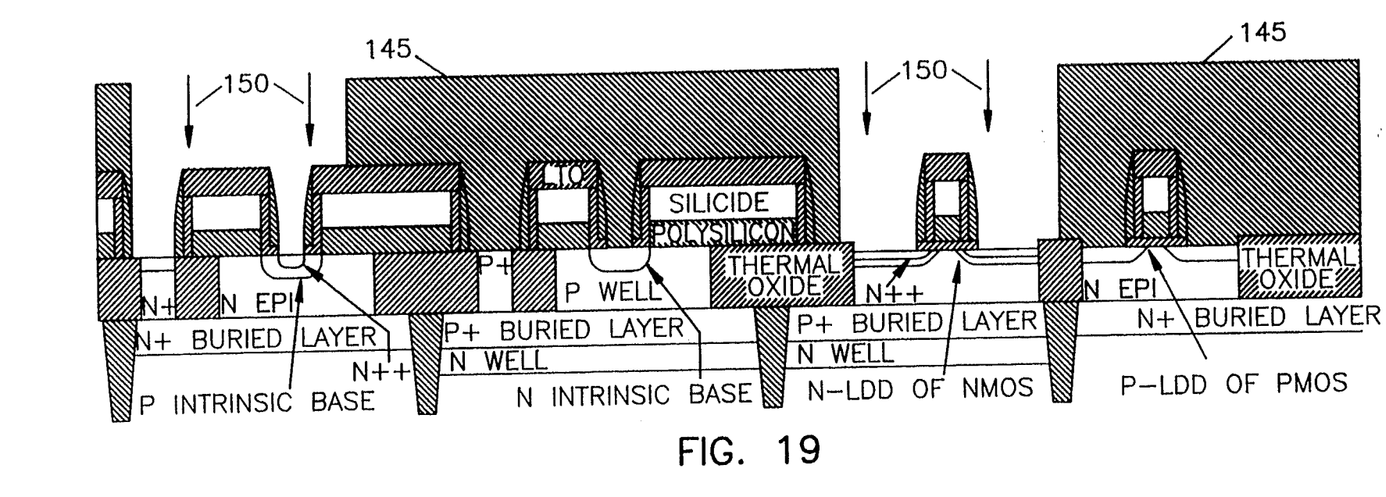
FIG. 19 is an illustration of the structure of FIG. 18 showing the use of another resist to pattern the npn collector and emitter areas as well as the CMOS source/drain areas.

Next, the thin oxide areas that were exposed (such as 130 and 132 in FIG. 15) are etched with the result shown in FIG. 18. Once this is done, a photoresist 145 is used to pattern the npn collector and emitter areas as well as the NMOS source/drain areas and then As is implanted, as shown by arrows 150 in FIG. 19. Then, photoresist 145 is stripped and the process is repeated for the pnp collectors, bases and the PMOS source/drain areas, using $BF_2$ implants. The step of repeating the process for the pnp transistor is not shown in the drawings.

Figure 20:
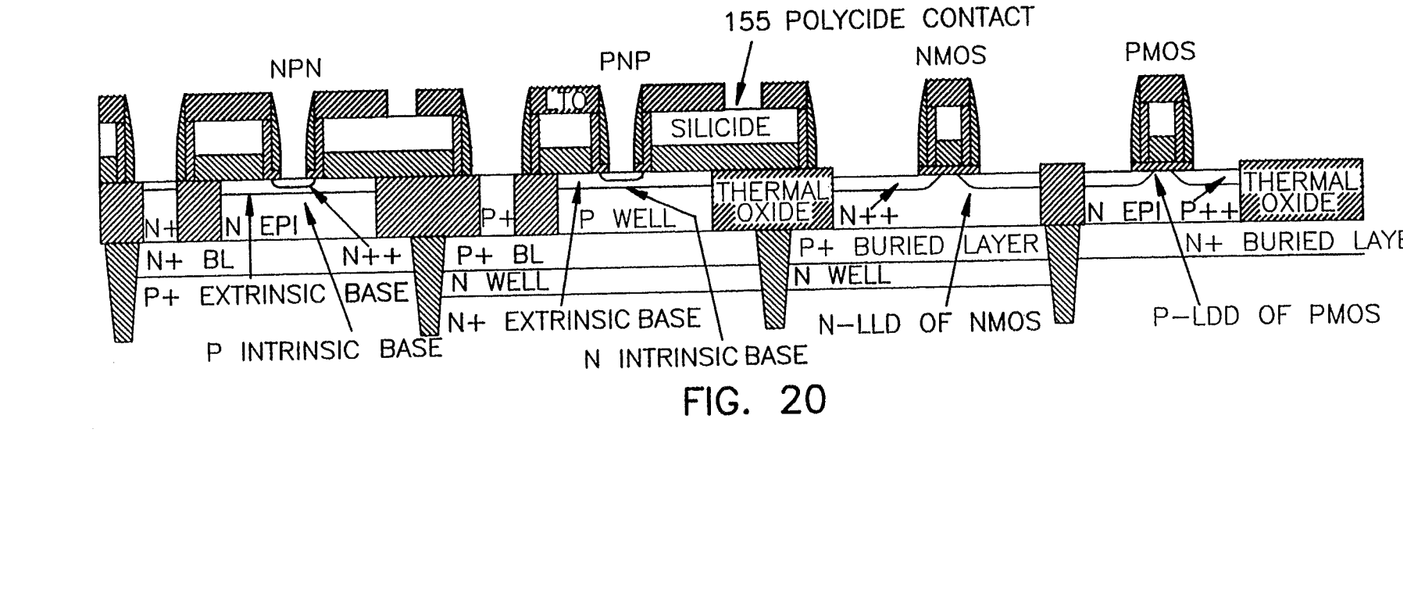
FIG. 20 is an illustration of the structure of FIG. 19 after a polycide contact has been defined and etched.
Figure 21:
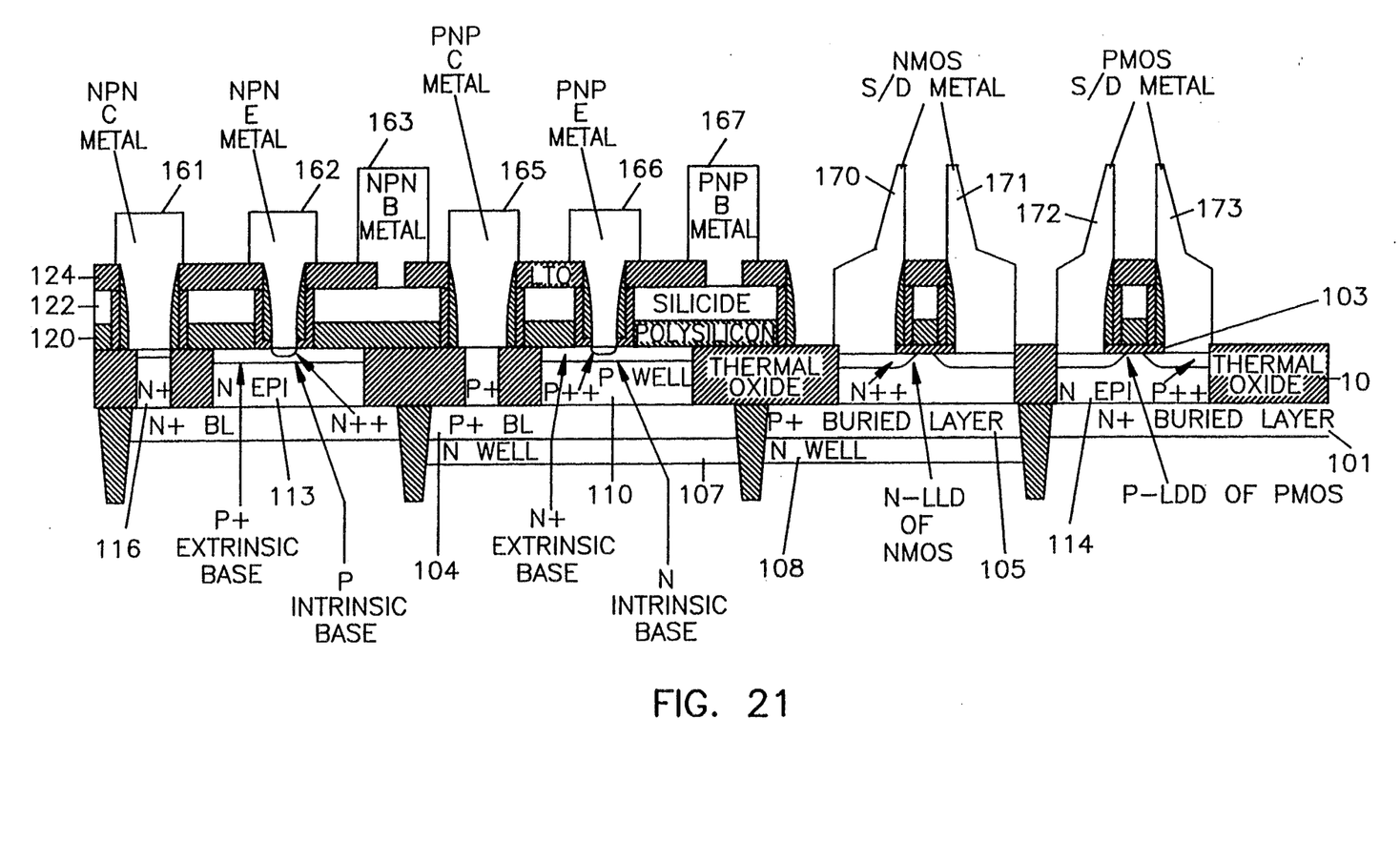
FIG. 21 is an illustration of the structure of FIG. 20 after a step of metalization for all the devices has been performed.

The final drive-in step is performed and the polycide contact 155 is defined and etched as shown in FIG. 20. Alternatively, separate drive-in steps can be used for the npn and pnp transistors to optimize the doping profiles. This way, it is easy to compensate for the fact that arsenic diffuses much slower than boron. Metalization for all the devices can be performed using one mask and one metal layer, resulting in the structure according to the second embodiment of the present invention, as shown in FIG. 21. Contacts 161, 162 and 163 correspond to the collector, emitter and base of an npn transistor. Contacts 165, 166 and 167 correspond to the collector, emitter and base of a pnp transistor. Contacts 170 and 171 correspond to the source and/or drain of an nmos device. Finally, contacts 173 and 174 correspond to the source and/or drain of a pmos device.

Figure 22:
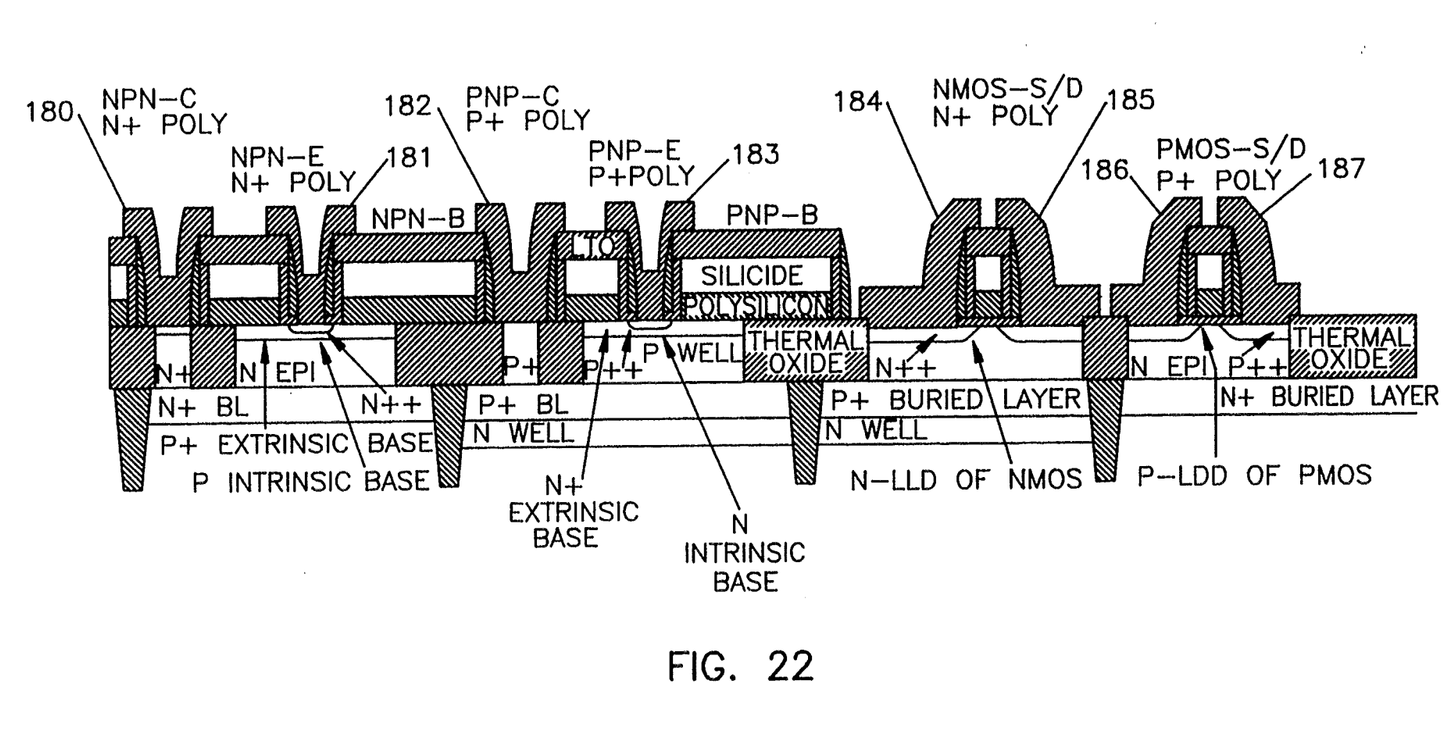
FIG. 22 is an illustration of the structure according to a third embodiment of the present invention in which a polysilicon contact is used instead of a metal.

A third embodiment of the present invention is shown in FIG. 22. This embodiment is similar to the second embodiment as shown in FIG. 21, with the exception that polysilicon is used, instead of metal, to form the contacts. In particular, n+ polysilicon is used to contact the collector 180 and emitter 181 of the npn transistor as well as the source and/or drain areas 184, 185 of the NMOS device. Conversely, p+ polysilicon is used to contact the collector 182 and emitter 183 of the pnp transistor as well as the source and/or drain regions 186, 187 of the PMOS device. The advantages of using polysilicon instead of metal are the higher current gain of the bipolar transistors and the ability to contact the source and/or drains of the CMOS devices over the field oxide area, which allows for a reduction in the CMOS device active area (a result akin to the use of the extrinsic base with the bipolar transistor).

Figure 23:
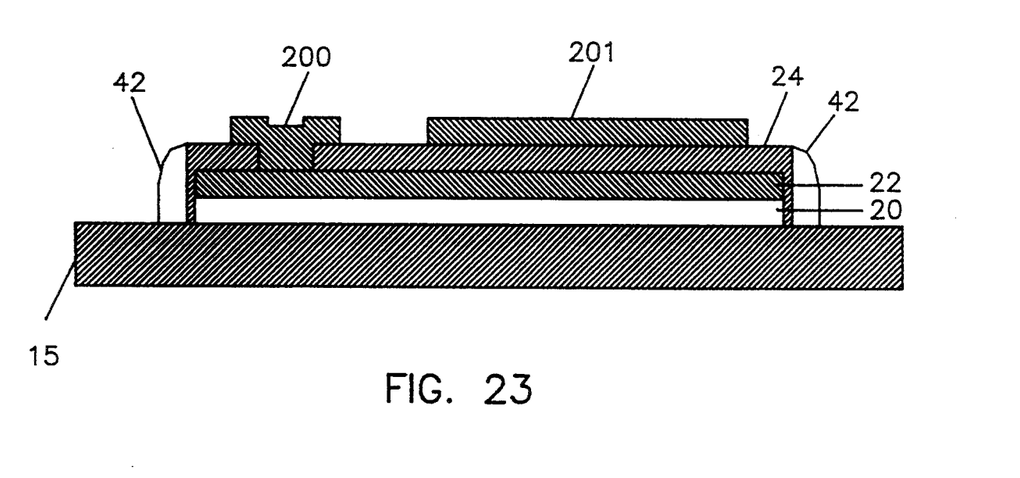
FIG. 23 is an illustration of a capacitor formed according to an embodiment of the present invention.

An example of a capacitor that can also be formed simultaneously with the bipolar and CMOS devices is shown in FIG. 23. The LTO 24, silicide 22 and polysilicon 20 stack formed on a field oxide region 15 and surrounded by nitride spacers 42 form the capacitor. Contact 200 is formed to be in contact with silicide layer 22. Contact 201 lies entirely on top of LTO 24.

Figure 24:
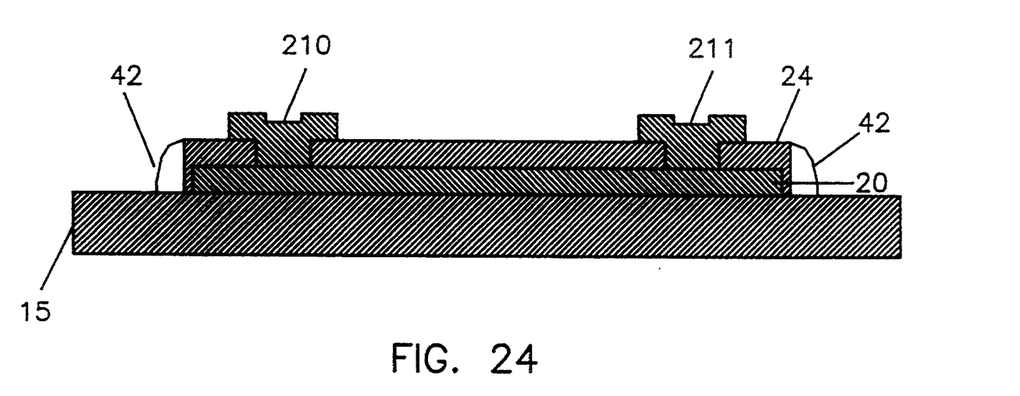
FIG. 24 is an illustration of a resistor formed according to an embodiment of the present invention.

An example of a resistor that can also be formed simultaneously with the bipolar and CMOS devices is shown in FIG. 24. Here, LTO 24 is deposited directly upon polysilicon layer 20 overlying field oxide region 15 and surrounded by nitride spacers 42. Contacts 210 and 211 are both directly connected to polysilicon layer 20.

While the present invention has been disclosed above with particular reference to the preferred embodiments shown, those embodiments are presented by way of example, not by way of limitation. Those of ordinary skill in the art would be enabled by this disclosure to add to or modify these embodiments of the invention in various ways as needed and still be within the scope and spirit of the present invention as recited in the appended claims.

What is claimed is:

1. A method for forming an integrated circuit having complementary bipolar transistors with minimized extrinsic base resistance and CMOS devices with minimized gate resistances on a silicon substrate, wherein the substrate has been selectively formed so as to be P-type in the regions where PNP bipolar and NMOS are formed and to be N-type in the regions where NPN bipolar and PMOS devices are formed and has active regions and field oxide regions defined thereon, comprising the steps of:

depositing a polysilicon layer on top of the substrate;

depositing a silicide layer on top of the polysilicon layer and selectively doping the silicide layer using a first photoresist mask;

forming a low temperature deposited oxide layer (LTO) on top of the silicide layer;

selectively etching the LTO, silicide, and polysilicon layers so as to define extrinsic base regions of the bipolar transistors and gate regions of the CMOS devices in regions where the LTO, silicide, and polysilicon layers were not etched away;

oxidizing the substrate to form a thin oxide layer to cover any areas on the substrate that are no longer covered by oxide and to densify the LTO;

selectively implanting a P-type impurity into NPN bases and PMOS sources and drains using the remaining LTO, silicide, and polysilicon to self-align the NPN bases and the PMOS sources and drains to those remaining LTO, silicide, and polysilicon layers and using a second photoresist mask to protect regions unintended to be implanted with P-type dopant;

selectively implanting an N-type impurity into PNP bases and NMOS sources and drains using the remaining LTO, silicide, and polysilicon to self-align the PNP bases and the NMOS sources and drains to those remaining LTO, silicide, and polysilicon layers and using a third photoresist mask to protect regions unintended to be implanted with N-type dopant;

depositing nitride and etching the nitride to form inside spacers on vertical surfaces of the remaining LTO, silicide, and polysilicon layers resulting from the selective etching step;

etching away portions of the thin oxide layer where NPN collector and emitter areas and NMOS source and drain areas are to be formed and implanting the N-type impurity into those areas, such that the emitter areas are self-aligned by the inside spacers; and etching away portions of the thin oxide layer where PNP collector and emitter areas and PMOS source and drain areas are to be formed and implanting the P-type impurity into those areas, such that the emitter areas are self-aligned by the inside spacers.

2. The method according to claim 1, further comprising the step of:

performing a final drive-in step.

3. The method according to claim 1, further comprising the, step of metalizing using a mask to form contacts for the bipolar transistors and CMOS devices.

4. The method according to claim 1, further comprising the step of alternatively depositing and selectively doping polysilicon onto the substrate to form contacts for the bipolar transistors and CMOS devices.

5. The method according to claim 3, wherein the silicide layer comprises $WSi_x$ 2500 to 3000 Angstroms thick and the polysilicon layer is 500 to 3000 Angstroms thick.

6. The method according to claim 3, wherein the LTO is preferably 0.1 to 0.3 $\mu$m thick.

7. The method according to claim 6, wherein the step of thermally oxidizing the substrate to form the thin oxide layer is performed at 800–1000 degrees Celsius.

8. The method according to claim 7, wherein the thin oxide layer is 200 to 1000 Angstroms thick.

9. A method for forming an integrated circuit having complementary bipolar transistors having minimized extrinsic base resistance and CMOS devices having minimized gate resistance on a silicon substrate, wherein the substrate has been selectively formed so as to be P-type in the regions where PNP bipolar and NMOS devices are formed and to be N-type in the regions where NPN bipolar and PMOS devices are formed and has active regions and field oxide regions defined thereon, comprising the steps of:

depositing a silicide layer on top of the substrate and selectively doping the silicide layer using a first photoresist mask;

forming an low temperature deposited oxide layer (LTO) on top of the silicide layer;

selectively etching the LTO and silicide layers so as to define extrinsic base regions of the bipolar transistors and gate regions of the CMOS devices in regions-where the LTO and silicide layers were not etched away;

oxidizing the substrate to form a thin oxide layer to cover any areas on the substrate that are no longer covered by oxide and to densify the LTO;

selectively implanting a P-type impurity into NPN bases and PMOS sources and drains using the remaining LTO and silicide to self-align the NPN bases and the PMOS sources and drains to those remaining LTO and silicide layers and using a second photoresist mask to protect regions unintended to be implanted with P-type dopant;

selectively implanting an N-type impurity into PNP bases and NMOS sources and drains using the remaining LTO and silicide to self-align the PNP bases and the NMOS sources and drains to those remaining LTO and silicide layers and using a third photoresist mask to protect regions unintended to be implanted with N-type dopant;

depositing nitride and etching the nitride to form inside spacers on vertical surfaces of the remaining LTO and silicide layers resulting from the selective etching step;

etching away portions of the thin oxide layer where NPN collector and emitter areas and NMOS source and drain areas are to be formed and implanting the N-type impurity into those areas, such that the emitter areas are self-aligned by the inside spacers; and etching away portions of the thin oxide layer where PNP collector and emitter areas and PMOS source and drain areas are to be formed and implanting the P-type impurity into those areas, such that the emitter areas are self-aligned by the inside spacers.

10. The method according to claim 9, further comprising the step of:

performing a final drive-in step.

11. The method according to claim 9, further comprising the step of metalizing using a mask to form contacts for the bipolar transistors and CMOS devices.

12. The method according to claim 9, further comprising the step of alternatively depositing selectively doped polysilicon onto the substrate to form contacts for the bipolar transistors and CMOS devices.

13. The method according to claim 11, wherein the silicide layer comprises $WSi_x$ 2500 to 3000 Angstroms thick, and wherein x is selected to be within the range of 1.8 and 2.5.

14. The method according to claim 11, wherein the LTO is preferably 0.1 to 0.3 $\mu$m thick.

15. The method according to claim 14, wherein the step of thermally oxidizing the substrate to form the thin oxide layer is performed at 800–1000 degrees Celsius.

16. The method according to claim 15, wherein the thin oxide layer is 200 to 1000 Angstroms thick.

* * * * *